US009773959B2

(12) United States Patent
Fujitomo et al.

(10) Patent No.: US 9,773,959 B2
(45) Date of Patent: Sep. 26, 2017

(54) OPTICAL-SEMICONDUCTOR DEVICE AND METHOD FOR MANUFACTURING THE SAME

(71) Applicant: NICHIA CORPORATION, Anan-shi, Tokushima (JP)

(72) Inventors: Masato Fujitomo, Yokohama (JP); Hiroto Tamaki, Anan (JP); Shinji Nishijima, Anan (JP); Yuichiro Tanda, Tokyo (JP); Tomohide Miki, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 14/603,148

(22) Filed: Jan. 22, 2015

(65) Prior Publication Data

US 2015/0129923 A1 May 14, 2015

Related U.S. Application Data

(62) Division of application No. 14/059,243, filed on Oct. 21, 2013, now Pat. No. 8,975,100, which is a division
(Continued)

(30) Foreign Application Priority Data

Sep. 9, 2008 (JP) ................................. 2008-231569
Mar. 11, 2009 (JP) ................................. 2009-057258
Jul. 31, 2009 (JP) ................................. 2009-179812

(51) Int. Cl.
*H01L 33/48* (2010.01)
*H01L 33/62* (2010.01)
(Continued)

(52) U.S. Cl.
CPC .............. *H01L 33/62* (2013.01); *H01L 24/97* (2013.01); *H01L 31/02002* (2013.01);
(Continued)

(58) Field of Classification Search
None
See application file for complete search history.

(56) References Cited

U.S. PATENT DOCUMENTS 6,545,332 B2 * 4/2003 Huang .............. H01L 27/14618
257/433
8,093,619 B2 1/2012 Hayashi et al.
(Continued)

FOREIGN PATENT DOCUMENTS

CN 1674316 A 9/2005
CN 101236996 A 8/2008
(Continued)

OTHER PUBLICATIONS

European Search Report issued in European Application No. 09169701.1 on Nov. 21, 2014.
(Continued)

*Primary Examiner* — Daniel Whalen
(74) *Attorney, Agent, or Firm* — Birch, Stewart, Kolasch & Birch, LLP

(57) ABSTRACT

A method for manufacturing an optical-semiconductor device, including forming a plurality of first and second electrically conductive members that are disposed separately from each other on a support substrate; providing a base member formed from a light blocking resin between the first and second electrically conductive members; mounting an optical-semiconductor element on the first and/or second electrically conductive member; covering the optical-semiconductor element by a sealing member formed from a
(Continued)

translucent resin; and obtaining individual optical-semiconductor devices after removing the support substrate.

20 Claims, 8 Drawing Sheets

Related U.S. Application Data of application No. 13/240,460, filed on Sep. 22, 2011, now Pat. No. 8,604,507, which is a division of application No. 12/555,478, filed on Sep. 8, 2009, now Pat. No. 8,377,725.

(51) Int. Cl.
*H01L 23/00* (2006.01)
*H01L 31/0203* (2014.01)
*H01L 31/02* (2006.01)
*H01L 33/52* (2010.01)
*H01L 25/16* (2006.01)

(52) U.S. Cl.
CPC ........ *H01L 31/0203* (2013.01); *H01L 33/486* (2013.01); *H01L 33/52* (2013.01); *H01L 25/167* (2013.01); *H01L 2224/48091* (2013.01); *H01L 2224/48247* (2013.01); *H01L 2224/48465* (2013.01); *H01L 2224/97* (2013.01); *H01L 2924/01012* (2013.01); *H01L 2924/01029* (2013.01); *H01L 2924/01322* (2013.01); *H01L 2924/12041* (2013.01); *H01L 2924/12042* (2013.01); *H01L 2924/12043* (2013.01); *H01L 2924/12044* (2013.01); *H01L 2924/14* (2013.01); *H01L 2924/181* (2013.01); *H01L 2924/1815* (2013.01); *H01L 2924/3025* (2013.01)

(56) References Cited

U.S. PATENT DOCUMENTS

| | | | | |
|---|---|---|---|---|
| 8,604,507 | B2* | 12/2013 | Fujitomo | H01L 33/486 257/99 |
| 8,975,100 | B2* | 3/2015 | Fujitomo | H01L 33/486 257/99 |
| 2001/0022390 | A1 | 9/2001 | Waitl et al. | |
| 2005/0009242 | A1 | 1/2005 | Chang | |
| 2005/0045903 | A1 | 3/2005 | Abe et al. | |
| 2005/0219835 | A1 | 10/2005 | Nagayama | |
| 2005/0280017 | A1 | 12/2005 | Oshio et al. | |
| 2006/0043607 | A1 | 3/2006 | Matsuura et al. | |
| 2007/0126356 | A1* | 6/2007 | Tanda | H01L 33/486 313/512 |
| 2008/0093606 | A1 | 4/2008 | Pan et al. | |
| 2008/0185610 | A1 | 8/2008 | Kushimatsu et al. | |
| 2008/0186714 | A1 | 8/2008 | Nagayama | |
| 2008/0187762 | A1* | 8/2008 | Hayashi | B29C 45/02 428/413 |
| 2008/0254650 | A1* | 10/2008 | Kadotani | H01L 33/54 439/56 |
| 2009/0022198 | A1 | 1/2009 | Chen et al. | |
| 2009/0050925 | A1 | 2/2009 | Kuramoto et al. | |
| 2009/0212316 | A1 | 8/2009 | Braune et al. | |
| 2009/0315049 | A1* | 12/2009 | Urasaki | H01L 33/486 257/98 |
| 2010/0155739 | A1 | 6/2010 | Kuramoto et al. | |
| 2010/0314654 | A1 | 12/2010 | Hayashi | |
| 2011/0002587 | A1 | 1/2011 | Bogner et al. | |
| 2011/0024786 | A1 | 2/2011 | Sugiyama | |
| 2011/0241055 | A1 | 10/2011 | Urasaki et al. | |
| 2014/0319569 | A1 | 10/2014 | Urasaki et al. | |
| 2015/0001563 | A1* | 1/2015 | Miki | H01L 33/54 257/98 |

FOREIGN PATENT DOCUMENTS

| | | | |
|---|---|---|---|
| DE | 10 2005 041 064 A1 | 3/2007 | |
| DE | 10 2007 001 706 A1 | 7/2008 | |
| EP | 1 914 811 A1 | 4/2008 | |
| JP | 2000-82847 A | 3/2000 | |
| JP | 2000-150969 A | 5/2000 | |
| JP | 2002-335020 A | 11/2002 | |
| JP | 2004-172160 A | 6/2004 | |
| JP | 2005-79329 A | 3/2005 | |
| JP | 2006-140207 | 6/2006 | |
| JP | 2006-156704 A | 6/2006 | |
| JP | 2006-310630 A | 11/2006 | |
| JP | 2007-19096 A | 1/2007 | |
| JP | 2007-157940 A | 6/2007 | |
| JP | WO 2007142018 A1 * | 12/2007 | .......... H01L 33/486 |
| TW | 445600 B | 7/2001 | |
| TW | 521408 B | 2/2003 | |
| TW | 525277 B | 3/2003 | |
| WO | WO 2007/015426 A1 | 2/2007 | |
| WO | WO 2007/025515 A1 | 3/2007 | |
| WO | WO 2007/135707 A1 | 11/2007 | |
| WO | WO 2007/142018 A1 | 12/2007 | |
| WO | WO 2008/081794 A1 | 7/2008 | |

OTHER PUBLICATIONS

Japanese Office Action issued on Jun. 4, 2013 for Japanese patent Application No. 2009-179812.
U.S. Notice of Allowance issued in U.S. Appl. No. 14/059,243 on Oct. 16, 2014.
US Office Action dated Apr. 4, 2013 issued in U.S. Appl. No. 13/240,460.
US Office Action dated Jun. 21, 2012 issued in U.S. Appl. No. 12/555,478.
US Office Action dated Nov. 18, 2011 issued in U.S. Appl. No. 12/555,478.
Chinese Office Action issued in corresponding Chinese Application No. 201410136422.1 on Jul. 19, 2016.
Japanese Office action dated Jun. 6, 2017 for Japanese Patent Application No. 2016-023015.

* cited by examiner

OPTICAL-SEMICONDUCTOR DEVICE AND METHOD FOR MANUFACTURING THE SAME

CROSS REFERENCE TO RELATED APPLICATIONS

This application is a Divisional of co-pending U.S. application Ser. No. 14/059,243 filed on Oct. 21, 2013, which in turn is a Divisional under 35 U.S.C. §120 of U.S. application Ser. No. 13/240,460 filed on Sep. 22, 2011, now U.S. Pat. No. 8,604,507, which in turn is a divisional under 35 U.S.C. §120 of U.S. application Ser. No. 12/555,478 filed on Sep. 8, 2009, now U.S. Pat. No. 8,377,725, which claims priority under 35 U.S.C. §120; and this application claims priority under 35 U.S.C. §119 of Application No. 2008-231569 filed in Japan on Sep. 9, 2008, Application No. 2009-057258, filed in Japan on Mar. 11, 2009, and Application No. 2009-179812 filed in Japan on Jul. 31, 2009. The entire contents of all these applications are hereby incorporated by reference.

BACKGROUND OF THE INVENTION

Field of the Invention

The present invention relates to an optical-semiconductor device including a light emitting device that can be used in display apparatus, illumination apparatus, backlight source for liquid crystal display and the like, and a light receiving device that can be used in video camera, digital still camera and the like, and a method for manufacturing the same. In particular, the present invention relates to a thin or compact optical-semiconductor device that has a high light-extraction efficiency and high contrast and can be manufactured with high yield, and a method for manufacturing the same.

Description of the Related Art

As electronics apparatuses become more compact and light-weight in recent years, efforts have also been made on optical-semiconductor devices such as light emitting device (light emitting diode, etc.) and light receiving device (CCD, photodiode, etc.) that are mounted on the electronics apparatuses, thereby developing compact ones. These optical-semiconductor devices comprise, for example, a double-side mounting printed circuit board with through holes that is made by forming metal circuit patterns on both sides of an insulating board. An optical-semiconductor elements such as light emitting element or light receiving element are mounted on the double-side mounting printed circuit board with through holes, and the optical-semiconductor elements are connected to the circuit pattern for electrical connection by using wires.

However, it is imperative for the optical-semiconductor device to use the double-side mounting printed circuit board with through holes. Since the double-side mounting printed circuit board with through holes has thickness of about 0.1 mm or more, it makes an obstacle to the effort of making a surface-mounted type optical-semiconductor device thinner.

For this reason, optical-semiconductor devices that do not use such a printed circuit board have been developed (refer to, for example, Japanese Unexamined Patent Publication (Kokai) No. 2005-79329).

The light emitting device disclosed in Japanese Unexamined Patent Publication (Kokai) No. 2005-79329 is made thinner than the conventional surface-mounted type light emitting device, by sealing electrodes that are formed from thin metal film by vapor deposition or the like on a substrate, together with light emitting element by means of a translucent resin.

However, since only the translucent resin is used, light-extraction efficiency is likely to decrease as light escapes from the light emitting element through the bottom surface. A structure of cone-shaped metal film for reflecting light has been proposed, although providing such a metal film makes it necessary to form pits in the surface of the substrate. Since the light emitting device is small in size, the pits must be very small and are difficult to form. In addition, because the structure has the pits, light emitting device is prone to breakage when the substrate is peeled off from the device, which leads to a lower yield of production and other problems. Also when the light emitting device is used in a display or the like, use of the translucent resin only tends to cause lower contrast.

SUMMARY OF THE INVENTION

In order to solve the problems described above, the method for manufacturing the optical-semiconductor device of the present invention comprises: (a) forming a plurality of first and second electrically conductive members that are disposed separately from each other on a support substrate; (b) providing a base member formed from a light blocking resin between the first and second electrically conductive members; (c) mounting an optical-semiconductor element on the first and/or second electrically conductive member; (d) covering the optical-semiconductor element by a sealing member formed from a translucent resin; and (e) obtaining individual optical-semiconductor devices after removing the support substrate. This method makes it possible to easily manufacture the thin optical-semiconductor device that has high light-extraction efficiency.

An optical-semiconductor device of the present invention comprises: an optical-semiconductor element; a first electrically conductive member having a top surface whereon the optical-semiconductor element is mounted and a bottom surface that constitutes the external surface of the optical-semiconductor device; a second electrically conductive member that is separated from the first electrically conductive member and has a bottom surface that constitutes the external surface of the optical-semiconductor device; a base member having a light blocking resin and is disposed between the first electrically conductive member and the second electrically conductive member; and a sealing member having a translucent resin and covers the optical-semiconductor element, wherein the first and second electrically conductive members are formed by plating. This constitution enables it to make a thin optical-semiconductor device.

The present invention makes it possible to easily produce the thin optical-semiconductor device with a high yield. Also because light emitted by the light emitting element can be prevented from leaking through the bottom surface even in the thin optical-semiconductor device, it is made possible to obtain an optical-semiconductor device having improved light-extraction efficiency and an optical-semiconductor device having improved contrast.

DETAILED DESCRIPTION OF THE INVENTION

Figure 1A:
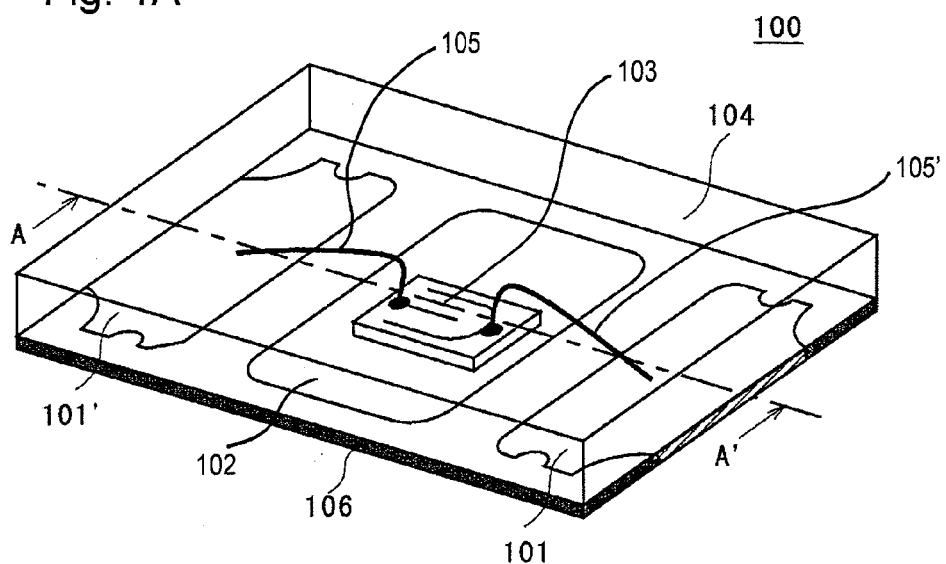
FIG. 1A is a perspective view showing the exterior and interior structure of the optical-semiconductor device of the present invention.

Embodiments of the present invention will be described by making reference to the accompanying drawings. It should be understood, however, that the embodiments described below are mere exemplification of the optical-semiconductor device of the present invention and a method for manufacturing the same, and are not intended to restrict the present invention.

This specification does not restrict the members described in the claims to those described in the embodiments. Dimensions, materials, shapes and relative positions of the components described in the embodiments, in particular, are mere examples that do not define the scope of the present invention, unless specifically restrictive statement is given. Dimensions and positional relationship of the components may be exaggerated in the drawings for the purpose of making it easier to understand. Further in the description that follows, an identical name or identical reference numeral represents the same or similar component, and detailed description thereof will be omitted.

Embodiment 1

Figure 1B:
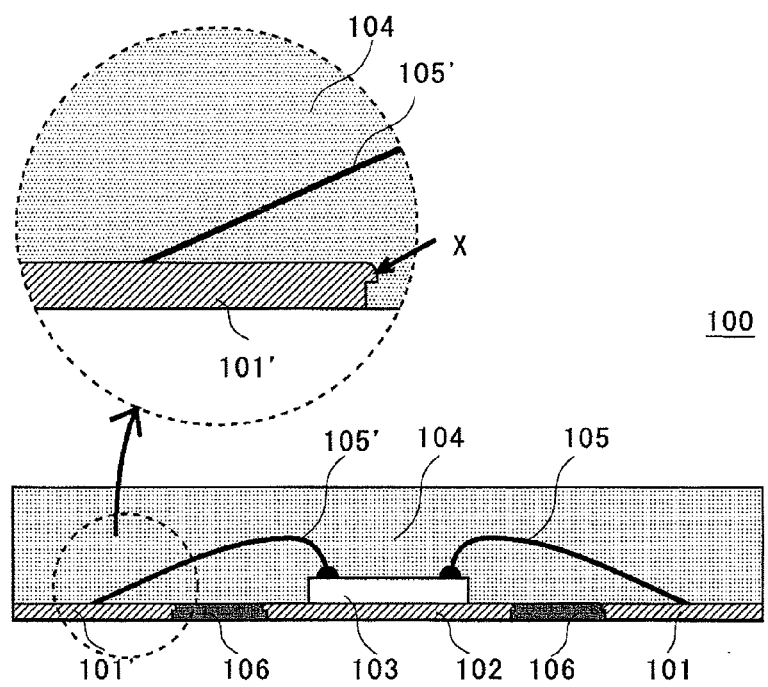
FIG. 1B shows a sectional view taken along lines A-A' of the optical-semiconductor device shown in FIG. 1A and an enlarged view of a part thereof.

An optical-semiconductor device (light emitting device) 100 of this embodiment is shown in FIG. 1A and FIG. 1B. FIG. 1A is a perspective view of the light emitting device 100. FIG. 1B is a sectional view taken along lines A-A' of the light emitting device 100 shown in FIG. 1A.

In this embodiment, the light emitting device 100 comprises a light emitting element 103, first electrically conductive members 101, 101' that are electrically connected to the light emitting element 103, a second electrically conductive member 102 that is disposed separately from the first electrically conductive members 101, 101' and has the light emitting element 103 mounted thereon, and a sealing member 104 that covers the light emitting element 103 and makes contact with the first electrically conductive members 101, 101' and the second electrically conductive member 102 as shown in FIG. 1A and FIG. 1B. In addition, a base member 106 formed from a resin capable of blocking the light emitted by the light emitting element 103 is provided between the first electrically conductive members 101, 101' and the second electrically conductive member 102.

(Base Member 106)

In this embodiment, the base member 106 is formed from a resin capable of blocking the light emitted by the light emitting element 103 by adding a light blocking filler or the like, and is provided between the first electrically conductive members 101, 101' and the second electrically conductive member 102. Providing the light blocking base member 106 at this position makes it possible to prevent the light emitted by the light emitting element 103 from leaking through the bottom surface of the light emitting device 100 to the outside, and improve the light-extraction efficiency in the direction upward.

Thickness of the base member 106 may be such that can prevent the light from leaking through the bottom surface of the light emitting device 100. The base member 106 is preferably disposed so as to contact both the side faces of the first electrically conductive members 101, 101' and the side face of the second electrically conductive member 102, in other words, so that the sealing member 104 does not exist between the first electrically conductive members 101, 101' and the base member 106, or between the second electrically conductive member 102 and the base member 106.

In case the first electrically conductive member 101, 101' or the second electrically conductive member 102 has a width that is different from the width of the light emitting device 100, for example, width of the first electrically conductive member 101, 101' is smaller than the width of the light emitting device 100 and the side faces of the first electrically conductive member 101, 101' and the side face of the light emitting device 100 are located apart from each other, then the base member may be provided also at this position as shown in FIG. 1A. With this constitution, the bottom surface of the light emitting device 100 is constituted from the first electrically conductive members 101, 101', the base member 106 and the second electrically conductive member 102, and therefore light can be effectively prevented from leaking through the bottom surface.

The base member 106 may be formed from any material as long as it can block the light emitted by the light emitting element. It is preferable, however, to use a material that has linear expansion coefficient proximate to that of the support substrate with small difference. It is more preferable to use an insulating material, such as thermosetting resin or thermoplastic resin. In case the electrically conductive member has a very small thickness such as 25 μm to 200 μm, in particular, it is preferable to use a thermosetting resin that allows it to form an extremely thin base member. Specifically, (a) an epoxy resin composition, (b) a silicone resin composition, (c) a modified epoxy resin composition such as a silicone-modified epoxy resin, (d) a modified silicone resin composition such as an epoxy-modified silicone resin, (e) polyimide resin composition and (f) a modified polyimide resin composition may be used.

A thermosetting resin, particularly a resin described in Japanese Unexamined Patent Publication (Kokai) No. 2006-156704 or U.S. patent application Ser. No. 12/162,974 (published as US2009-50925) is preferably used. The contents of them (JP2006-156704 and U.S. patent application Ser. No. 12/162,974) are incorporated herein as reference. Among the thermosetting resins, for example, an epoxy resin, a modified epoxy resin, a silicone resin, a modified silicone resin, an acrylate resin, a urethane resin and the like are preferably used. More specifically, it is preferable to use a solid epoxy resin composition that contains a colorless and transparent mixture prepared by mixing and dissolving (i) an epoxy resin composed of triglycidyl isocyanurate and hydrogenated bisphenol A triglycidyl ether and (ii) an acid anhydride composed of hexahydrophthalic anhydride, 3-methylhexahydrophthalic anhydride and 4-methylhexahydrophthalic anhydride, to be an equivalence. Further it is preferable to use a solid epoxy resin composition that has been turned into B stage by adding 0.5 parts by weight of DBU (1,8-diazabicyclo(5,4,0)undecene-7) as a curing accelerator, 1 part by weight of ethylene glycol as an auxiliary catalyst, 10 parts by weight of a titanium oxide pigment and 50 parts by weight of a glass fiber to 100 parts by weight of the mixture described above, and heating so as to accelerate the reaction to partially cure.

It is also preferable to use a thermosetting epoxy resin composition of which essential component is an epoxy resin that contains a triazine derivative epoxy resin described in International Publication No. WO 2007/015426 or U.S. patent application Ser. No. 11/997,734, the content of which is incorporated herein as reference For example, it is preferable to include a 1,3,5-triazine derivative epoxy resin. An epoxy resin having an isocyanurate ring, in particular, has high resistance to light and high electric insulating property. It is desirable that the resin has a divalent, more preferably trivalent epoxy group for one isocyanurate ring. Specifically, tris(2,3-epoxypropyl) isocyanurate, tris($\alpha$-methylglycidyl) isocyanurate or the like may be used. It is preferable that the triazine derivative epoxy resin has a softening point in a range from 90 to 125° C. The triazine derivative epoxy resin may also be used together with a hydrogenated epoxy resin or other epoxy resins. In case a silicone resin composition is used, a silicone resin that contains a methyl-silicone resin is preferably used.

A case of using triazine derivative epoxy resin will be specifically described. It is preferable to use an acid anhydride that acts as a curing agent on the triazine derivative epoxy resin. Light resistivity can be improved, in particular, by using an acid anhydride that is not an aromatic compound and does not include carbon-carbon double bond. Specifically, hexahydrophthalic anhydride, methyl-hexahydrophthalic anhydride, trialkyltetrahydrophthalic anhydride, hydrogenated methylnadic anhydride and the like may be used. Among these, methylhexahydrophthalic anhydride is particularly preferably used. It is also preferable to use an antioxidant, such as those based on phenol or sulfur. For the curing catalyst, those known as the curing catalyst for an epoxy resin composition may be used.

A filler that enhances light-blocking effect and, if required, various additives may be added to these resins. The resins together with these additives will be referred to as a light blocking resin, which constitutes the base member 106. Permeability to light can be controlled by mixing fine particles of $TiO_2$, $SiO_2$, $Al_2O_3$, MgO, $MgCO_3$, $CaCO_3$, $Mg(OH)_2$, $Ca(OH)_2$ or the like as the filler. It is preferable to block about 60% of the light from the light emitting element, more preferably about 90% or more. The base member 106 may either reflect or absorb the light. In case the optical-semiconductor device is used for such an application as illumination, it is preferable to block light by reflection rather than by absorption. In this case, it is preferable to reflect about 60% or more of the light from the light emitting element, more preferably about 90% or more.

The filler materials listed above may be used individually or in a combination of two or more kinds. For example, a filler that regulates the reflectivity and a filler that regulates the linear expansion coefficient to be described later may be used together. In case $TiO_2$ is used as a filler of white color, it is preferably added in proportion of 10 to 30 wt %, more preferably 15 to 25 wt %. $TiO_2$ of either rutile type or anatase type may be used, while rutile type is preferably used for the reason of light blocking property and resistance to light. When it is desired to improve dispersing characteristic and resistance to light, a filler that has been modified through surface treatment may also be used. Oxide hydrate or oxide such as alumina, silica, zinc oxide may be used in the surface treatment of the filler consisting of $TiO_2$. In addition to these, it is preferable to add 60 to 80 wt %, more preferably 65 to 75 wt % of $SiO_2$ as a filler. It is preferable to use amorphous silica, that has lower linear expansion coefficient, rather than crystalline silica. The particle size of the filler is preferably 100 μm or less, and more preferably 60 μm or less. Further, particle shape of the filler is preferably spherical, which makes it possible to improve the filling performance of the filler when molding the base member. When it is desired to improve contrast in an application for display or the like, a filler that absorbs 60% or more of the light emitted by the light emitting element, more preferably 90% or more of the light is preferably used. In this case, (a) carbon such as acetylene black, activated carbon or graphite, (b) oxide of transition metal such as iron oxide, manganese dioxide, cobalt oxide or molybdenum oxide, or (c) organic pigment may be used in accordance to the purpose.

It is preferable to control the linear expansion coefficient of the base member so that it has smaller difference from the linear expansion coefficient of the support substrate that is removed before dividing into individual devices. The liner expansion coefficient of the base member is preferably 0.5 to 2 times as large as the liner expansion coefficient of the support substrate. The difference between the linear expansion coefficient of the base member and that of the support substrate is preferably 30% or less, and more preferably 10% or less. In case the support substrate is formed from SUS, the difference in linear expansion coefficient is preferably 20 ppm or less, and more preferably 10 ppm or less. In this case, it is preferable to add 70 wt % or more, and more preferably 85 wt % or more filler, which makes it possible to control (relax) the residual stress in the support substrate and the base member, so that the combined array of the optical-semiconductors before being divided into individual devices can be suppressed from warping. As warping is reduced, damages caused inside such as breakage of electrically conductive wires can be decreased and positional error can be suppressed from occurring when dividing into individual devices, which improves the yield of production. Linear expansion coefficient of the base member is preferably controlled within a range from 5 to $25\times10^{-6}$/K, more preferably from 7 to $15\times10^{-6}$/K, which makes it easier to suppress warping from taking place when the base member is cooled down after being molded, thus making it possible to manufacture with high yield. In this specification, the linear expansion coefficient refers to the linear expansion coefficient of the base member, that may be formed from the light blocking resin prepared with various fillers added thereto, at a temperature below the glass transition temperature thereof. A material having such a linear expansion coefficient, in this temperature range, proximate to the linear expansion coefficient of the support substrate is preferably used.

From another point of view, linear expansion coefficient of the base member is preferably controlled to be proximate to the linear expansion coefficient of the first and second electrically conductive members. The liner expansion coefficient of the base member is preferably 0.5 to 2 times as large as the liner expansion coefficient of the first and second electrically conductive members. The difference between the linear expansion coefficient of the base member and that of the first and second electrically conductive members is preferably 40% or less and more preferably 20% or less. This suppresses a peeling off of the first and second electrically conductive members from the base member in the divided individual devices, and thus makes it possible to manufacture a optical-semiconductor device having high reliability.

(First Electrically Conductive Member 101, 101'/Second Electrically Conductive Member 102)

The first and second electrically conductive members 101, 101' serve as a pair of electrodes for supplying electrical power to the optical-semiconductor element. In this embodiment, the first electrically conductive member is electrically connected to the optical-semiconductor element (light emitting element) by means of an electrically conductive wire, bump or the like, and functions as an electrode that supplies electric power from the outside. The second electrically conductive member functions as a support for the light emitting element that is placed thereon, either directly or indirectly via another member such as sub-mount. The second electrically conductive member 102 may simply support the light emitting element placed thereon without contributing to the power supply. Alternatively, the second electrically conductive member 102 may contribute to the power supply to the light emitting element and protective element. In other words, the second electrically conductive member 102 may also function as an electrode. In the first embodiment, the second electrically conductive member 102 is used as a support for the light emitting element without contributing to the power supply.

In this embodiment, both the first electrically conductive member and the second electrically conductive member constitute the external surface at the bottom of the optical-semiconductor device (light emitting device), in other words to be exposed to the outside (bottom surface) without being covered by a sealing member or the like. For both the first electrically conductive member and the second electrically conductive member, the shape and dimensions in the top view thereof can be appropriately determined in accordance to the size of the light emitting device and the number and size of the light emitting elements to be mounted on the. The first electrically conductive member 101, 101' and the second electrically conductive member 102 preferably have substantially the same thickness, that is preferably in a range from 25 µm to 200 µm, and more preferably from 50 µm to 100 µm. The electrically conductive member having such a thickness is preferably formed by plating (plated layer), more preferably multiple plated layers.

(First Electrically Conductive Member 101, 101')

In this embodiment, the first electrically conductive members 101, 101' are provided, one on each of the opposing two sides of the light emitting device 100 that has substantially rectangular shape in top view as shown in FIG. 1A. The first electrically conductive member 101 and the first electrically conductive member 101' are provided so as to interpose the second electrically conductive member 102 via the base member 106 therebetween. Since the second electrically conductive member 102 is used to support the light emitting element without contributing to the power supply in this embodiment, two first electrically conductive members 101, 101' are used to serve as a pair of positive and negative electrodes.

The first electrically conductive members 101, 101' have top surfaces that are electrically connected to the light emitting element 103 via the electrically conductive wires 105, 105' and bottom surfaces that constitute the external surface of the light emitting device 100. The first electrically conductive members 101, 101' are provided so as to be exposed to the outside without being covered by the base member 106.

Top surfaces of the first electrically conductive members 101, 101' are where the electrically conductive wires 105, 105' are bonded so as to establish electrical connection with the light emitting element 103, and is required only to have an area necessary for the bonding. Top surfaces of the first electrically conductive members 101, 101' may be either flat as shown in FIG. 1B, or have fine surface irregularities, grooves, pits or the like. In case the electrodes of the light emitting element and the first electrically conductive member are electrically connected directly with each other without using electrically conductive wire, the first electrically conductive member is provided so as to have a sufficient area for bonding the electrodes of the light emitting element thereto.

Bottom surfaces of the first electrically conductive members 101, 101' constitute the external surface of the optical-semiconductor device, and are preferably formed substantially flat, although fine surface irregularities may exist.

Side surfaces of both the first electrically conductive members 101, 101' may be flat. However, it is preferable that a projection X, as shown in the enlarged partial view of FIG. 1A, is formed on the side face of the first electrically conductive member 101, 101' to be better attached with the base member 106. The projection X is preferably provided at a position located away from the bottom surfaces of the first electrically conductive members 101, 101', so that such a problem can be suppressed from occurring as the first electrically conductive members 101, 101' come down off the base member 106. Instead of the projection X, the side faces of the first electrically conductive member 101, 101' and the second electrically conductive member 102 may be tilted so that the bottom surfaces of the first electrically conductive member and the second electrically conductive member are narrower than the top surfaces thereof. This also suppresses these members from coming down off.

The projection X may be provided at any position in the circumference of the first electrically conductive members 101, 101', as long as it is not on the external surface of the light emitting device 100. For example, the projection may be provided at selected positions such as the opposing two sides of the electrically conductive member that has substantially rectangular shape in top view. In order to prevent the electrically conductive member from coming down off more surely, it is preferable to form the projection X along the entire circumference of the electrically conductive member, except for the surface that constitutes the external surface.

(Second Electrically Conductive Member 102)

In this embodiment, the second electrically conductive member 102 has a top surface whereon the light emitting element 103 is mounted and a bottom surface that constitutes the external surface of the light emitting device 100, as shown in FIG. 1B. Also the second electrically conductive member 102 does not function as electrode in this embodiment. Therefore, the second electrically conductive member 102 may be disposed so that all the side faces thereof are covered by the base member 106, in other words to be located away from the side faces of the light emitting device 100 as shown in FIG. 1A. With this structure, it can be easily cut to produce the individual light emitting device, as the cutting edge can be prevented from touching the second electrically conductive member 102. The second electrically conductive member 102 may also be disposed such that a part thereof constitutes the external surface of the light emitting device 100, namely so as to reach the side face of the light emitting device 100 (not shown). Since the second electrically conductive member 102 has the light emitting element 103 mounted thereon, heat dissipation can be improved by increasing the area.

Top surface of the second electrically conductive member 102 is required to have an area at least necessary for mounting the light emitting element 103 thereon. Besides the substantially rectangular shape in top view shown in FIG. 1A, various shapes may be employed such as polygon, corrugated shape and notched shape. The area where the light emitting element 103 is mounted is preferably flat. The second electrically conductive member 102 may have a protective element or the like in addition to the light emitting element 103 mounted on the top surface thereof.

Side surfaces of the second electrically conductive member 102 may be flat, although it is preferable that there is projection X as shown in FIG. 1B similarly to the case of the first electrically conductive member 101, 101', to be better attached to the base member 106. The projection X is preferably provided at a position located away from the bottom surface of the second electrically conductive member 102, so that such a problem can be suppressed from occurring, as the second electrically conductive member 102 comes down off the base member 106. The projection X may be provided at any position in the circumference of the second electrically conductive member 102. For example, the projection X may be provided at selected positions such as the opposing two sides of the second electrically conductive member 102 that has rectangular shape in top view. In order to prevent the electrically conductive member from coming off more surely, it is preferable to form the projection X along the entire circumference of the second electrically conductive member 102.

The first electrically conductive member 101, 101' and the second electrically conductive member 102 are preferably formed from the same material. This reduces the number of steps. But, the two members may also be formed from different materials. Specifically, metals such as copper, aluminum, gold, silver, tungsten, molybdenum, iron, nickel and cobalt, or alloy of these metals (such as iron-nickel alloy), phosphor bronze, copper-clad iron, eutectic solder such as Au—Sn, solder such as SnAgCu and SnAgCuIn, ITO and the like may be used. Among soldering materials, such a composition is preferred as the solder and a metal to be joined by the solder form an alloy with higher melting point after the solder material has melted and solidified, so that the material would not melt again during additional heat treatment when reflowing.

These materials may be used either individually or in the form of alloy. Moreover, the electrically conductive member may be formed in multiple layers of plating. In case the light emitting element, for example, it is preferable to use a material that can reflect the light from the light emitting element 103 at least for the surface layer of the electrically conductive member. Specifically, gold, silver, copper, Pt, Pd, Al, W, Mo, Ru, Rh or the like is preferably used. In addition, it is preferable that the surface layer of the electrically conductive member has high reflectivity and high luster. Reflectivity to visible light is preferably 70% or higher, and accordingly, such a material as Ag, Ru, Rh, Pt or Pd is preferably used. Surface luster of the electrically conductive member is also preferably higher. Surface luster is preferably 0.5 or higher, more preferably 1.0 or higher. The figure of surface luster is a value measured by means of a micro surface color difference meter VSR 300A manufactured by NIPPON DENSHOKU INDUSTRIES CO., LTD. with irradiation angle of 45°, measuring area of 0.2 mm in diameter and perpendicular light reception. It is preferable to use, on the support substrate side of the electrically conductive member, a material such as eutectic solder plating containing Au, Sn, Sn alloy, AuSn, etc. This is advantageous for mounting on a circuit board or the like.

An intermediate layer may be formed between the surface layer (top layer) of the electrically conductive member and the last layer on the support substrate side (bottom layer). In order to increase the mechanical strength of the electrically conductive member and the light emitting device, it is preferable to use a metal that has high corrosion resistance such as Ni for the intermediate layer. In order to improve heat dissipation, it is preferable to use copper for the intermediate layer because copper has high heat conductivity. In this way it is preferable to use a material selected for the purpose and application for the intermediate layer. In addition to the metals described above, Pt, Pd, Al, W, Ru, Pd or the like may be used for the intermediate layer. The intermediate layer may also be formed from a metal that has high adhesibility with the top layer and the bottom layer. The intermediate layer is preferably thicker than the top layer and the bottom layer. Thickness of the intermediate layer is preferably in a range from 80% to 99%, more preferably from 90% to 99% of the total thickness of the electrically conductive member.

In case the electrically conductive member is formed by plating a metal, in particular, the bottom layer and the intermediate layer are preferably formed from materials that have linear expansion coefficient proximate to that of the support substrate since the linear expansion coefficient is determined by the composition. In case the support substrate is formed from SUS430 that has linear expansion coefficient of $10.4 \times 10^{-6}$/K, for example, the electrically conductive member formed thereon may have such a multiple layer structure that contains the following metals as the main component: Au (0.04 to 0.1 μm) having linear expansion coefficient of $14.2 \times 10^{-6}$/K for the bottom layer, Ni having linear expansion coefficient of $12.8 \times 10^{-6}$/K (or Cu having linear expansion coefficient of $16.8 \times 10^{-6}$/K) (25 to 100 μm) for the first intermediate layer, Au (0.01 to 0.07 μm) for the second intermediate layer and Ag (2 to 6 μm) having linear expansion coefficient of $119.7 \times 10^{-6}$/K for the top layer. While Ag used in the top layer has a linear expansion coefficient significantly different from those of other layers, Ag is used since preference is given to the reflectivity for the light from the light emitting element. Since the top layer of Ag is formed with extremely small thickness, it has only a weak influence on the warping, and therefore poses practically no problem.

(Sealing Member 104)

The sealing member 104 is provided for the purpose of covering the light emitting element 103 and making contact with the first electrically conductive member 101, 101' and the second electrically conductive member 102. The sealing member 104 protects the electronic components such as the light emitting element 103, light receiving element, the protective element and the electrically conductive wires 105, 105' from dust, moisture and external force.

The sealing member 104 is preferably formed from a material that has transparency, for allowing the light from the light emitting element to transmit therethrough, and light resistivity to endure the light without deteriorating. Specifically, insulating resin compositions that has transparency, for allowing the light from the light emitting element to transmit therethrough, such as a silicone resin composition, a modified silicone resin composition, an epoxy resin composition, a modified epoxy resin composition, an acrylic resin composition and the like may be used. Also a silicone resin, an epoxy resin, a urea resin, a fluororesin and a hybrid resin that contains at least one of these resins may be used. The material is not limited to these organic materials. Inorganic material such as glass or a silica sol may also be used. In addition to these materials, a coloring agent, a light diffusing agent, a light reflecting material, various fillers, a wavelength converting material (a fluorescent material) or the like may also be contained as required. Quantity of the sealing member may such that can cover the electronic components described above.

The sealing member 104 may be formed with various external shapes determined in accordance to the light distribution characteristic and other factors. The light distribution characteristic can be controlled, for example, by forming the top surface in the shape of convex lens, concave lens or Fresnel lens. Also in addition to the sealing member 104, a lens member may be provided. When a molded member containing a fluorescent material (such as molded sheet member containing a fluorescent material or molded dome member containing a fluorescent material) is used, the sealing member 104 is preferably formed from a material that can be readily joined with the molded member containing fluorescent material. The molded member containing fluorescent material may be formed from, besides a resin composition, an inorganic material such as glass.

While the sealing member 104 used in the light emitting device has been described, substantially the same as described above applies also to the light receiving device. In the case of the light receiving device, a white or black filler may be contained in the sealing member 104, for the purpose of increasing the efficiency of receiving light and avoid secondary reflection within the light receiving device. Also it is preferable to use a sealing member 104 that contains black filler in an infrared ray emitting apparatus or an infrared ray detecting apparatus, in order to avoid the interference of visible light.

(Joining Member)

A joining member is used to connect the light emitting element 103, the light receiving element, the protective element and the like to the first electrically conductive member 101, 101' and the second electrically conductive member 102. An electrically conductive joining member or an insulating joining member may be selected in accordance to the type of substrate of the element 103 to be mounted. In the case of optical-semiconductor element 103 constituted by forming nitride semiconductor layers on a sapphire substrate, for example, either insulating joining member or electrically conductive joining member may be used. When an electrically conductive substrate such as SiC is used, an electrically conductive joining member may be used to establish electrical conductivity. For the insulating joining member, epoxy resin composition, silicone resin composition, polyimide resin composition, modified resin thereof and hybrid resin may be used. When these resins are used, a metal layer having high reflectivity such as Al or Ag, or a reflecting film made of dielectric material may be formed on the back surface of the light emitting element 103, to prevent deterioration from being caused by light and heat generated by the optical-semiconductor element 103. In this case, such a method may be used as vapor deposition, sputtering or bonding of thin film. For the electrically conductive joining member, an electrically conductive paste such as silver, gold or palladium, solder such as Au—Sn eutectic alloy, brazing material such as low-melting point metal or the like may be used. In case a transparent joining member, among these joining member materials, is used, it may include a fluorescent material that absorbs light emitted by the semiconductor light emitting element and emits light of different wavelength.

(Electrically Conductive Wire 105, 105')

The electrically conductive wires that connect the electrodes of the light emitting element 103, the first electrically conductive member 101, 101' and the second electrically conductive member 102 with each other may be formed from a metal such as gold, copper, platinum, aluminum or the like, or an alloy thereof. It is particularly preferable to use gold that is excellent in high heat resistance, etc.

(Wavelength Converting Member)

The sealing member may include a fluorescent material as the wavelength converting member that absorbs at least a part of light emitted by the semiconductor light emitting element and emits light of different wavelength.

Efficiency of the fluorescent material is higher when it converts the light emitted by the semiconductor light emitting element into light of a longer wavelength. However, the fluorescent material is not limited to this, and various fluorescent materials may be used such as one that converts the light emitted by the semiconductor light emitting element into light of a shorter wavelength or one that converts the light that has been converted by other fluorescent material. For the fluorescent material, a single layer of one kind of fluorescent material may be formed, or a single layer of a mixture of two or more kinds of fluorescent material may be formed, or two or more layers each containing one kind of a fluorescent material may be formed, or two or more layers each containing two or more kinds of a fluorescent material may be formed.

In case a semiconductor light emitting element having light emitting layer formed from a nitride semiconductor is used as the light emitting element, a fluorescent material that absorbs light emitted by the light emitting element and emits light of different wavelength may be used. For example, nitride-based fluorescent material or oxide-nitride-based fluorescent material activated mainly with lanthanoid element such as Eu, Ce, etc. may be used. More specifically, at least one selected from among (a) α- or β-sialon-based fluorescent material activated with Eu, various alkaline earth metal aluminum nitride silicate fluorescent materials (for example, $CaSiAlN_3$:Eu, $SrAlSi_4N_7$:Eu), (b) alkaline earth metal halogen apatite, alkaline earth metal halogen silicate, alkaline earth metal silicate, alkaline earth metal element boride halogen, alkaline earth metal element aluminate, alkaline earth element sulfide, alkaline earth element thiogalate, alkaline earth element silicon nitride or germanate activated mainly with lanthanoid element such as Eu or transition metal element such as Mn, or (c) rare earth element aluminate, rare earth element silicate or alkaline earth metal rare earth silicate activated mainly with lanthanoid element such as Ce, and (d) organic compound or organic complex activated mainly with lanthanoid element such as Eu is preferably used. A YAG fluorescent material is preferably used that is rare earth element aluminate fluorescent material activated mainly with lanthanoid element such as Ce. YAG fluorescent materials are represented by formulas such as $Y_3Al_5O_{12}$: Ce, $(Y_{0.8}Gd_{0.2})_3Al_5O_{12}$: Ce, $Y_3(Al_{0.8}Ga_{0.2})_5O_{12}$: Ce, $(Y, Gd)_3(Al, Ga)_5O_{12}$. There also exist $Tb_3Al_5O_{12}$: Ce and $Lu_3Al_5O_{12}$: Ce formed by substituting a part or all of Y with Tb or Lu. Moreover, fluorescent materials other than those described above, having similar performance, operation and effect may also be used.

A member composed of glass or a molded body of resin composition or the like coated with a fluorescent material may also be used. Furthermore, a molding containing fluorescent material may also be used. Specifically, a fluorescent material-containing glass, sintered YAG material, a mixed sintered material of YAG and $Al_2O_3$, $SiO_2$, or $B_2O_3$, a bulk of a crystallized inorganic material where YAG is precipitated in a molten organic material may be used. The fluorescent material may also be molded integrally with epoxy, silicone or hybrid resin.

(Semiconductor Element)

In the present invention, the semiconductor element may have various structures. For example, the semiconductor element may have positive and negative electrodes formed on the same side, or may have positive and negative electrodes formed on different sides. Also, the semiconductor element may have a laminated substrate that is different from a film-growing substrate. It is preferable to use an optical-semiconductor light emitting element (which may also be referred to simply as light emitting element or light emitting diode) or a semiconductor light receiving element (which may also be referred to simply as light receiving element) having such a structure.

The optical-semiconductor light emitting element that operates at any desired wavelength may be selected. For the light emitting element that emits blue or green light, for example, ZnSe, nitride semiconductor ($In_XAl_YGa_{1-X-Y}N$, $0 \leq X$, $0 \leq Y$, $X+Y \leq 1$) or GaP may be used. For the light emitting element that emits red light, GaAlAs, AlInGaP or the like may be used. An optical-semiconductor light emitting element formed from a material other than the above may also be used. Composition, color of emitted light, size and number of the light emitting element to be used may be determined in accordance to the purpose.

To make light emitting device that has fluorescent material, it is preferable to use a nitride semiconductor ($In_XAl_YGa_{1-X-Y}N$, $0 \leq X$, $0 \leq Y$, $X+Y \leq 1$) that is capable of emitting light of a short wavelength that can efficiently excite the fluorescent material. Wavelength of the emitted light can be selected by controlling the materials of the semiconductor layer and mix proportions thereof.

A light emitting element that emits ultraviolet ray or infrared ray may also be used as well as visible light. Moreover, light receiving element may be mounted individually or together with the light emitting element.

For the light receiving element, photo IC, photodiode, phototransistor, CCD (charge-coupled device) image sensor, CMOS image sensor, Cd cell or the like may be used.

(Support Substrate)

The support substrate (not shown in FIGS. 1A and 1B) is a member having plate or sheet shape used for forming the first and second electrically conductive members 101, 101', 102 thereon. The support substrate is removed before being divided into individual devices, and therefore does not exist in the final optical-semiconductor device. The support substrate may be an electrically conductive metal plate such as a SUS plate, or an insulating plate such as polyimide whereon an electrically conductive film is formed by sputtering or vapor deposition. Alternatively, a member of insulating plate whereon a thin metal film is laminated may be used. In either case, the support substrate is removed in the final stage of manufacturing. That is, the support substrate must be removed from the first and second electrically conductive members 101, 101', 102 and the base member 106. For this reason, it is preferable to use the support substrate formed from a material that can be bended, and it is preferable to use a sheet member having thickness from 10 μm to 300 μm, depending on the kind of material. Preferred materials for the support substrate are, in addition to SUS plate described above, metal plates such as iron, copper, silver, kovar and nickel, and resin sheet such as one made of polyimide whereon a thin metal film can be laminated. Particularly, it is preferable to use stainless steels having such a phase as martensite, ferrite or austenite. Ferrite phase stainless steel is particularly preferable. Especially preferably used are 400 series and 300 series stainless steel. Specifically, SUS430 ($10.4 \times 10^{-6}$/K), SUS444 ($10.6 \times 10^{-6}$/K), SUS303 ($18.7 \times 10^{-6}$/K), SUS304 ($17.3 \times 10^{-6}$/K) and the like are preferably used. 400 series stainless steel is more easily roughened on the surface when subjected to acid treatment conducted as a pretreatment for plating, when compared with 300 series stainless steel. Plating layer formed on 400 series stainless steel that has been subjected to acid treatment also tends to be rough on the surface, which enables it to better hold a resin that constitutes the sealing member 104 or the base member 106. On the other hand, 300 series stainless steel is less likely to be roughened on the surface when subjected to acid treatment. Therefore, use of 300 series stainless steel allows it to obtain higher luster of the plating layer surface, leading to higher reflectivity of the light from the light emitting element 103, thus resulting in light emitting device having higher light-extraction efficiency.

To improve the surface luster of the first and second electrically conductive members 101, 101', 102, the layer may be formed by plating, vapor deposition, sputtering or the like. To obtain higher luster, the surface of the support substrate is preferably smooth. In case the support substrate is formed from SUS, for example, the electrically conductive member 101, 101', 102 having high surface luster can be formed by using 300 series SUS that has relatively small crystal grains.

The support substrate may also be provided with slit, groove, corrugated shape or the like, in order to mitigate warping after molding the resin.

(Manufacturing Method 1-1)

The method for manufacturing the light emitting device of the present invention will be described by making reference to the accompanying drawings. FIGS. 2A through 2H are process diagrams explanatory of the process of manufacturing an array 1000 of the light emitting device. The integrated array 1000 is cut off into individual devices, so as to obtain the light emitting device 100 that has been described in the first embodiment.

1. First Step

Figure 2A:
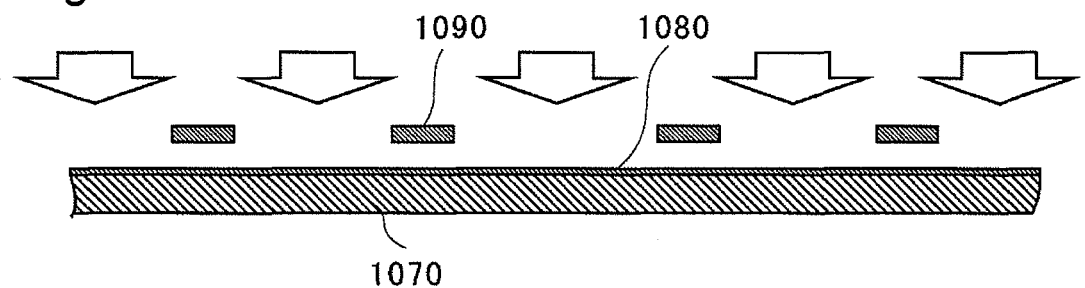
FIG. 2A through 2H are a process diagram explanatory of a method for manufacturing the optical-semiconductor device of the present invention.

First, a support substrate 1070 consisting of a metal plate or the like as shown in FIG. 2A is prepared. Surface of the support substrate is coated with a resist 1080 as a protective film. Thickness of the first electrically conductive member and the second electrically conductive member to be formed subsequently can be controlled by the thickness of the resist 1080. While the resist 1080 is provided on only the top surface (the surface whereon the first electrically conductive member, etc. are mounted) of the support substrate 1070 in this example, the resist may also be formed on the bottom surface (back surface). In this case, the electrically conductive member can be prevented from being formed on the bottom surface during the plating process to be described later, by providing the resist over substantially the entire surface of the back surface.

The protective film (resist) may be either positive type or negative type in case the resist is formed for the photolithography process. While a method using positive resist will be described here, a combination of positive type and negative type may also be employed. The resist may also be formed by screen printing, or a resist sheet may be laminated.

Figure 2B:
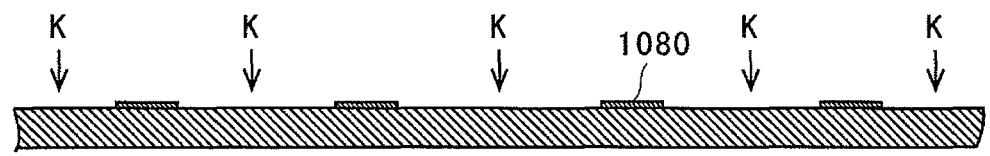

After drying the resist that has been applied, a mask 1090 having openings is placed directly or indirectly on top of the resist, and is irradiated with ultraviolet ray as indicated by an arrow in the drawing. Wavelength of the ultraviolet ray may be determined so as to suit the sensitivity of the resist 1070 and other factors. Then the resist 1080 having openings K as shown in FIG. 2B is obtained by processing with an etching solution. At this time, activation treatment with an acid may also be carried out.

Figure 2C:
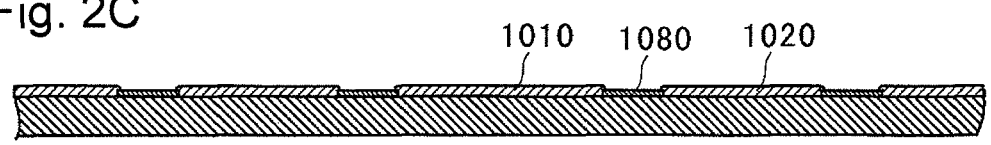

Then the first electrically conductive member 1010 and the second electrically conductive member 1020 are formed in the openings K of the resist 1080 as shown in FIG. 2C through plating of a metal. At this time, thickness of the plating may be made larger than the thickness of the resist 1080 by controlling the conditions of plating. Thus the electrically conductive members are formed over the top surface of the resist (protective film) and the projections X can be formed as shown in FIG. 1A. Proper method of plating known in the prior art may be selected in accordance to the metal to be used, or the desired thickness and flatness of the film. For example, electroplating or electroless plating may be employed. It is particularly preferable to employ electroplating which makes it easier to remove the resist (protective film) and form the electrically conductive member in constant shape. It is also preferable to form an intermediate layer (from, for example, Au or Ag) by strike plating below the top layer (from, for example, Ag) in order to improve adherence with the top layer.

Figure 2D:
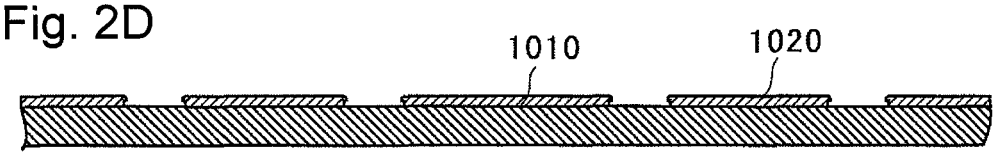

After plating, the protective film 1080 is washed and removed, so that the first electrically conductive member 1010 and the second electrically conductive member 1020 that are separated from each other are formed as shown in FIG. 2D. The projection X may also be formed by crushing, or baking after printing of metallic paste, besides the plating process described above.

2. Second Step

Figure 2E:
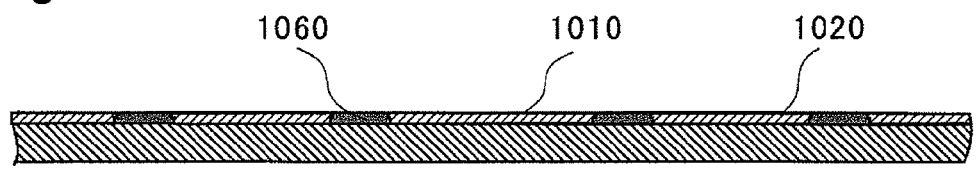

Then the base member 1060 that can reflect light from the light emitting element is provided between the first electrically conductive member 1010 and the second electrically conductive member 1020, as shown in FIG. 2E. The base member may be formed by any proper method such as injection molding, transfer molding or compression molding.

In case the base member 1060 is formed by transfer molding, for example, the support substrate having a plurality of the first and second electrically conductive members 1010, 1020 is set in a mold so as to be interposed between an upper mold and a lower mold. At this time, the substrate 1070 may be set in the mold via mold release paper. The mold is filled with resin pellets as the raw material of the base member, and the support substrate 1070 and the resin pellets are heated. The resin pellets are melted and pressurized so as to fill in the space in the mold. Heating temperature, heating time and pressure can be determined in accordance to the composition of the resin in use. After being cured, the molding shown in FIG. 2E is taken out of the mold.

3. Third Step

Figure 2F:
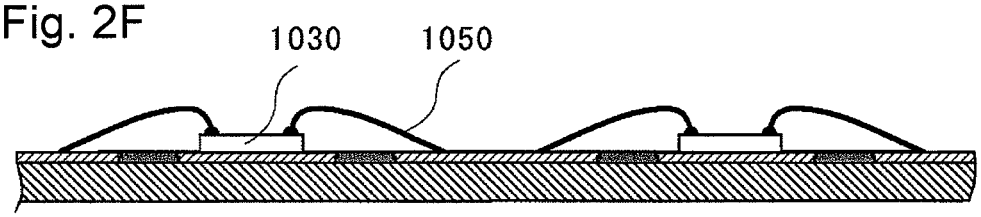

Then the light emitting element 1030 is bonded onto the second electrically conductive member 1020 by a joining member (not shown) as shown in FIG. 2F, and is connected via the electrically conductive wire 1050 to the first electrically conductive member 1010. While the light emitting element 1030 that has positive and negative electrodes on the same side thereof is used in this example, a light emitting element that has positive and negative electrodes on different sides thereof may also be used.

4. Fourth Step

Then the sealing member 1040 is formed so as to cover the light emitting element 1030 and the electrically conductive wire 1050 by transfer molding, potting, printing or other method. While the sealing member is formed in a single layer structure in this example, it may also be formed in multiple layers that have different compositions or properties. After curing the sealing member 1040, the support substrate 1070 is removed as shown in FIG. 2G.

5. Fifth Step

Figure 2G:
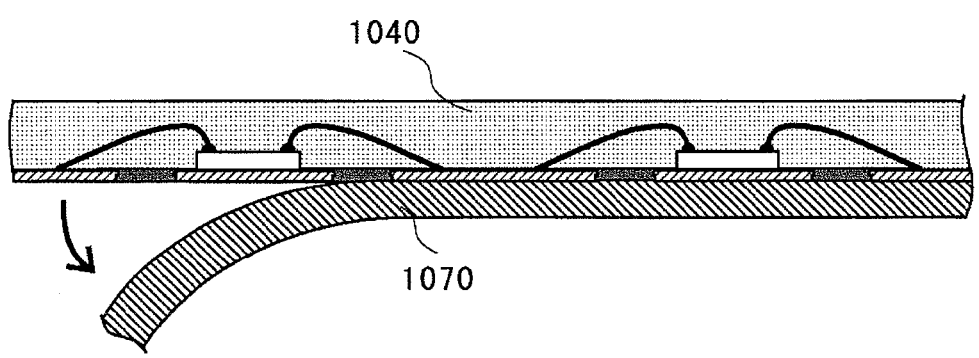

The array 1000 of the semiconductor device (light emitting device) as shown in FIG. 2G is obtained through the steps described above. Lastly, the array 1000 is cut off along dashed line shown in FIG. 2H so as to be separated into individual devices. Thus, the light emitting device 100 shown, for example, in FIG. 1A is obtained. Various methods may be employed for dividing into individual devices, such as dicing by means of a blade, dicing by laser beam, etc.

Figure 2H:
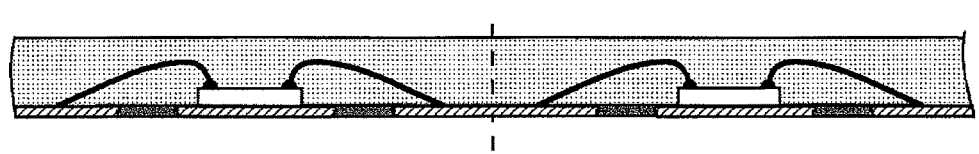

FIG. 2H shows an operation of cutting through the electrically conductive member, although the present invention is not limited to this, and the cutting position may be offset from the electrically conductive member. Cutting through the electrically conductive member makes it easier to bond with solder as the electrically conductive member is exposed also on the side face of the optical-semiconductor device. When the cutting position is apart from the electrically conductive member, on the other hand, what is cut off is only resin such as the base member 1060 and the sealing member 1040, and therefore it is easier to cut than in the case of cutting the electrically conductive member (metal) and the resin together.

(Manufacturing Method 1-2)

Now manufacturing method 1-2 wherein the first electrically conductive member 1010 and the second electrically conductive member 1020 are formed by etching will be described.

A thin film of electrically conductive member such as copper foil is laminated on the support substrate 1070 of plate shape formed from an insulating material such as polyimide. A protective film (dry resist sheet, etc.) of sheet shape is laminated onto the electrically conductive member, and is exposed to light via a mask that has openings, and the protective film in the portion exposed to light is removed by using a washing liquid such as weak alkaline solution. This leaves the protective film having openings being formed on the electrically conductive member.

Then the support substrate 1070 is immersed in an etching solution that is capable of etching the electrically conductive member, so as to etch the electrically conductive member. Lastly, the protective film is removed so that the first electrically conductive member 1010 and the second electrically conductive member 1020 located away from each other are formed on the support substrate 1070.

Embodiment 2

Figure 3A:
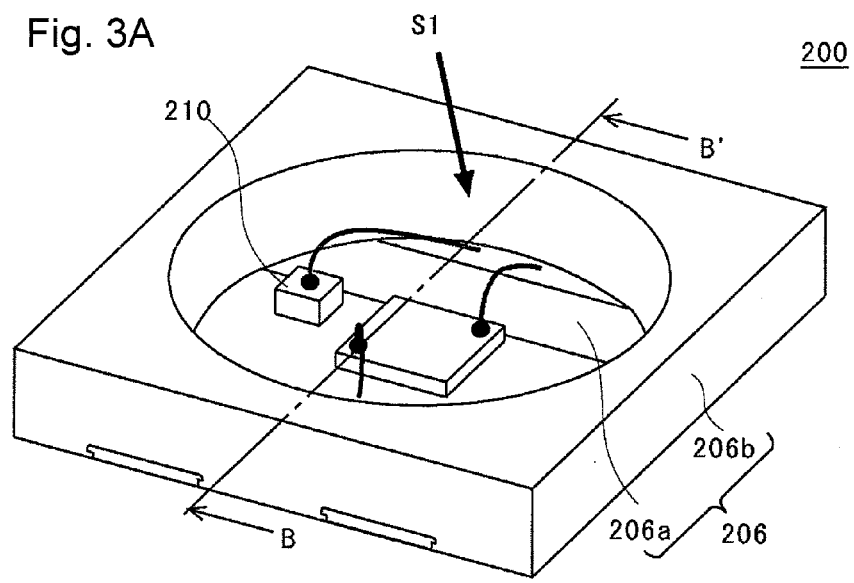
FIG. 3A is a perspective view showing the exterior and interior structure of the optical-semiconductor device of the present invention.
Figure 3B:
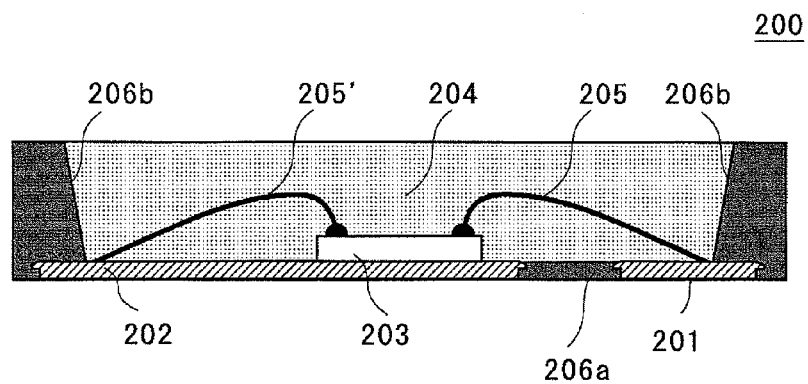
FIG. 3B shows a sectional view taken along lines B-B' of the optical-semiconductor device shown in FIG. 3A.

An optical-semiconductor device (light emitting device) 200 according to the second embodiment is shown in FIG. 3A and FIG. 3B. FIG. 3A is a perspective view showing the inside of the light emitting device 200 of the present invention, and FIG. 3B shows a sectional view taken along lines B-B' of the light emitting device 200 shown in FIG. 3A with a recess thereof being sealed.

The light emitting device 200 of the second embodiment comprises (a) a light emitting element 203 and a protective element 210, (b) a first electrically conductive member 201 electrically connected to the light emitting element 203 and to the protective element 210, (c) a second electrically conductive member 202 that is disposed separately from the first electrically conductive member 201 and has the light emitting element 203 mounted thereon, and (d) a sealing member 204 that covers the light emitting element 203 and contacts with the first electrically conductive member 201 and with the second electrically conductive member 202. The first electrically conductive member 201 and the second electrically conductive member 202 constitute, by the bottom surfaces thereof, the external surface of the light emitting device 200. Part of the side faces of the first electrically conductive member 201 and the second electrically conductive member 202 also constitute the external surface of the light emitting device 200. A base member 206 formed from a resin capable of blocking the light emitted by the light emitting element 203 is provided between the first electrically conductive member 201 and the second electrically conductive member 202. The base member 206 has a bottom portion between the first electrically conductive member 201 and the second electrically conductive member 202 and a protruding portion 206b that rises higher than the top surfaces of the first electrically conductive member 201 and the second electrically conductive member 202, at a position apart from the light emitting element 203. Thus the protruding portion 206b of the base member 206 constitutes a recess S1 in the light emitting device 200. The recess S1 makes it possible to suppress light from being emitted toward the side face of the light emitting device 200 and emit the light toward the top surface.

It is preferable that the protruding portion 206b has inclined inner surface so as to form the recess S1 that flares toward the top as shown in FIG. 3B. This configuration makes it easier to reflect the light in the direction toward above the light emitting device. The members used in the second embodiment may be similar to those of the first embodiment.

(Manufacturing Method 2)

The manufacturing method for the light emitting device 200 will be described with reference to the accompanying drawings. FIGS. 4A through 4D are a diagram explanatory of a step of forming an aggregate 2000 of the light emitting device. The light emitting device 200 described in the second embodiment is obtained by cutting off the aggregate 2000.

1. First Step

The first step of the manufacturing method 2 can be carried out similarly to the manufacturing method 1-1 and manufacturing method 1-2.

2. Second Step

Figure 4A:
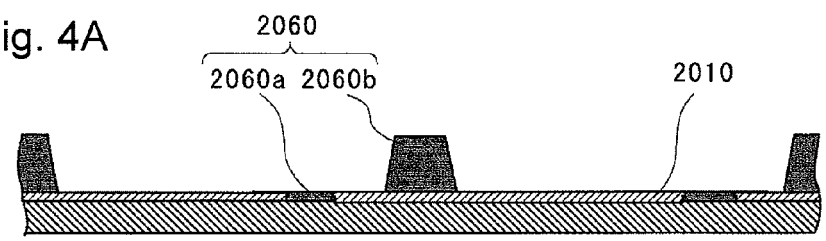
FIG. 4A through 4D are a process diagram explanatory of a method for manufacturing the optical-semiconductor device of the present invention.

In the second step, a protruding portion 2060b is formed at the same time as a bottom portion 2060a of the base member is formed in the second step as shown in FIG. 4A. While the protruding portion 2060b and the bottom portion 2060a are formed at the same time in this example, the protruding portion 2060b may be formed after forming the bottom portion 2060a, or the protruding portion 2060b may be formed first, followed by the formation of the bottom portion 2060a. While the protruding portion 2060b and the bottom portion 2060a are preferably formed from the same light blocking resin, they may also be formed from different light blocking resins depending on the purpose and application.

The protruding portion 2060b can be formed by transfer molding process or the like using a mold, similarly to the bottom portion 2060a of the base member. The protruding portion 2060b as shown in FIG. 4A can be formed by using an upper mold that has a recess.

3. Third Step

Figure 4B:
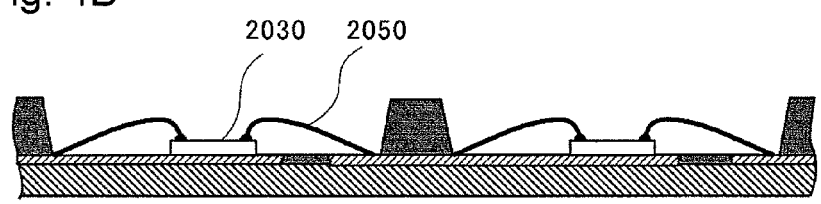
Figure 4C:
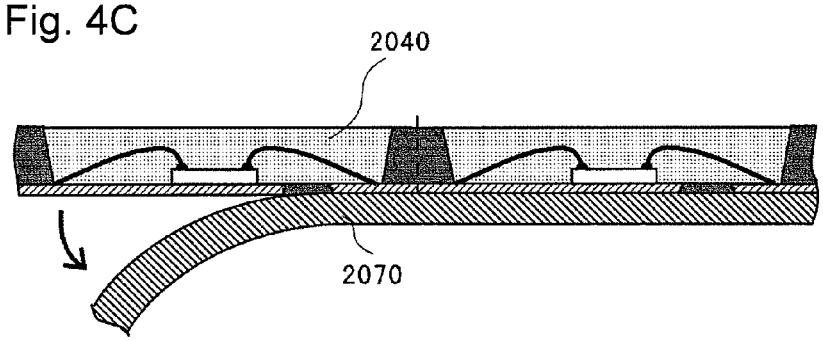

In the third step, the light emitting element 2030 is placed on the first electrically conductive member 2010 in a region surrounded by the protruding portion 2060b as shown in FIG. 4B. The electrically conductive wires 2050 are connected to the top surfaces of the first and second electrically conductive members in the region surrounded by the same protruding portion 2060b 4. Fourth Step In the fourth step, the recess formed by the surrounding protruding portion 2060b is filled with the sealing member formed from the translucent resin as shown in FIG. 4C so that the light emitting element is covered by the sealing member. While the sealing member 2040 is provided to a height substantially the same as the height of the protruding portion 2060b in this example, the present invention is not limited to this, and the sealing member may be either lower or higher than the protruding portion 2060b. The sealing member 2040 may also have flat top surface as in this example, or may have a curved surface with the middle recessed or protruding.

5. Fifth Step

Figure 4D:
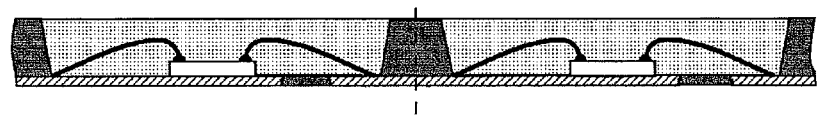

In the fifth step, the array is cut along the dashed line shown in FIG. 4D, namely at such a position that cuts the protruding portion 2060b, to divide into individual devices to obtain the optical-semiconductor device 200 shown in FIG. 3A. In the example illustrated, the array is cut at a position where the protruding portion 2060b is cut but the sealing member 2040 is not cut. Therefore, in the obtained device, the light direction can be restricted to the upward direction of the optical-semiconductor device (light emitting device) 200. In this way, light-extraction efficiency in the upward direction can be improved. While the protruding portion 2060 is cut off in this example, cutting operation may also be done at a position where the sealing member 2040 is cut.

Embodiment 3

Figure 5:
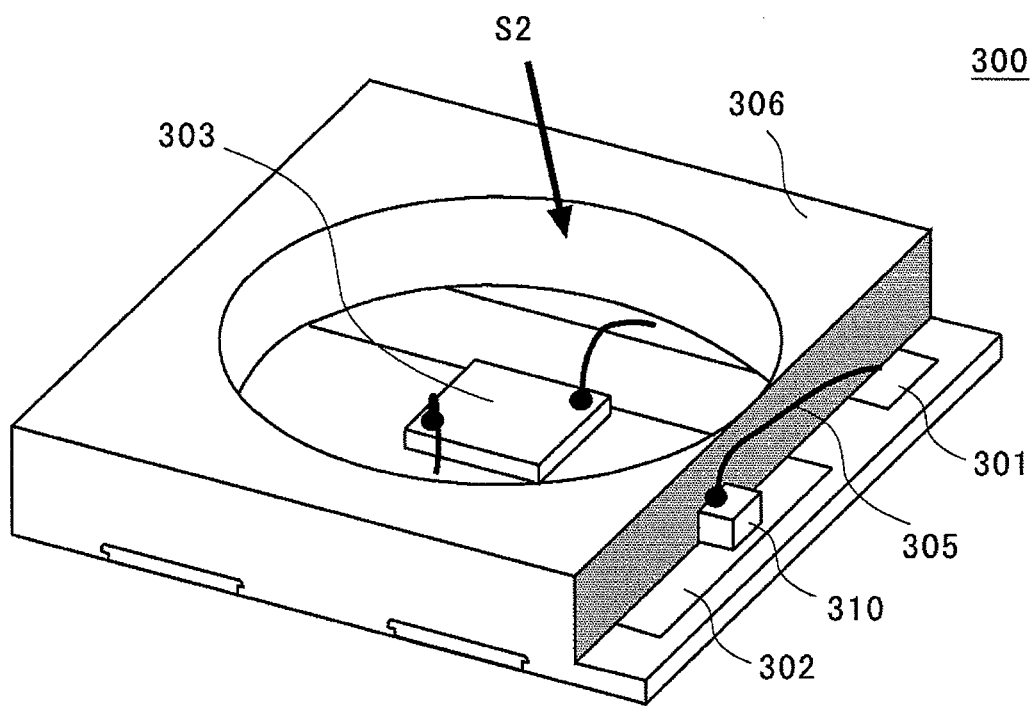
FIG. 5 is a perspective view showing the exterior and interior structure of the optical-semiconductor device of the present invention.

FIG. 5 is a perspective view showing the optical-semiconductor device of the present invention, with a part thereof being cut away to reveal the inside of a base member 306. In the third embodiment, a light emitting element 303 is mounted in a recess S2 that is surrounded by the protruding portion 306 of the base member, and a protective element 310 is embedded in the protruding portion 306 of the base member, as shown in FIG. 5. FIG. 5 is a diagram showing the inside of a part of the base member 306 of the optical-semiconductor device that has substantially rectangular parallelepiped shape as shown in FIG. 3A.

In the second step, before forming the base member, the protective element 310 is placed on the second electrically conductive member 302 and is connected to the first electrically conductive member 301 by means of the electrically conductive wire 305. Thus such a structure can be made as the protective element 310 is embedded in the base member 306. In the first embodiment, the light emitting element and the protective element are mounted in the third step, after forming the base member in the second step. In this embodiment, the light emitting element and the protective element are provided in different steps. The optical-semiconductor device can be made more compact by providing the protective element so as to be embedded in the base member as in this embodiment.

Embodiment 4

Figure 6A:
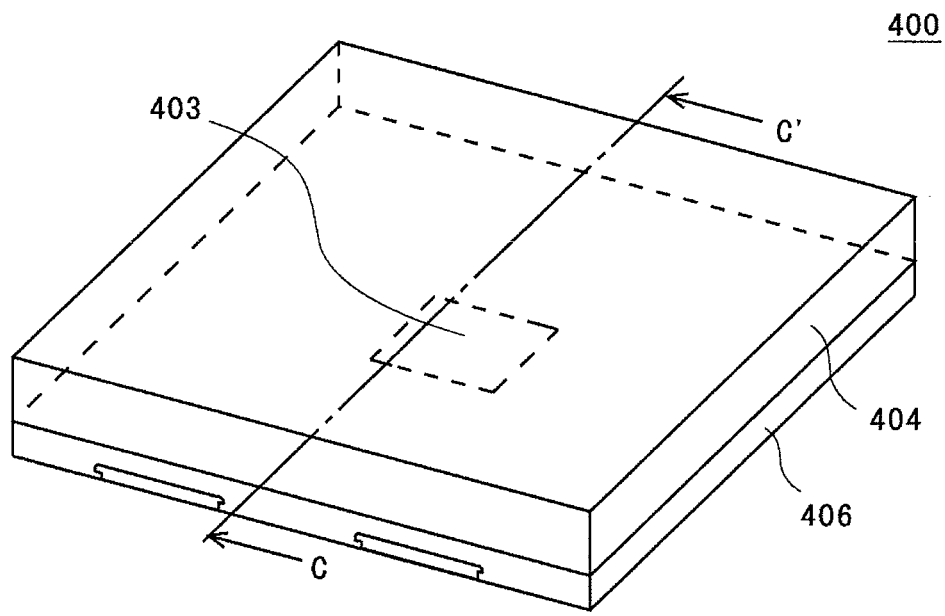
FIG. 6A is a perspective view showing the optical-semiconductor device of the present invention.
Figure 6B:
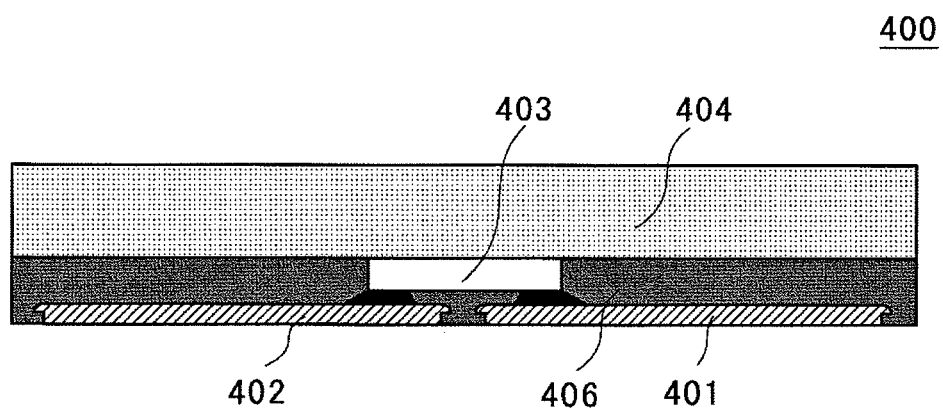
FIG. 6B shows a sectional view taken along lines C-C' of the optical-semiconductor device shown in FIG. 6A.

FIG. 6A is a perspective view showing the optical-semiconductor device of this embodiment, and FIG. 6B is a sectional view taken along lines C-C' in FIG. 6A. In the fourth embodiment, a base member 406 is provided so as to reach the side face of light emitting element 403, as shown in FIG. 6A and FIG. 6B. In this embodiment, the protruding portion that rises above the top surfaces of the first electrically conductive member and the second electrically conductive member is provided across the entire base member 406. Such a constitution can be obtained by carrying out the third step, namely the step of mounting the optical-semiconductor element on the first and/or second electrically conductive member, prior to the second step, namely the step of providing the base member formed from light blocking resin between the first and second electrically conductive members. Since the base member 406 is provided to a height substantially the same as the height of the optical-semiconductor element (light emitting element) 403 as shown in FIG. 6A and FIG. 6B, light is emitted only through the top surface of the light emitting element. This constitution makes it possible to extract light more efficiently.

While the base member (protruding portion) 406 is provided to a height substantially the same as the height of the light emitting element 403 in this embodiment, the base member 406 may be provided to be lower than the light emitting element 403. When the base member 406 as described above is provided, the sealing member 404 may be dripped or printed and cured on the light emitting element 403 and on the base member 406. Such a method may also be employed as the sealing member 404 that has been formed and cured in another step is bonded onto the base member 406 and the light emitting element 403. For example, the sealing member 404 formed by molding Al$_2$O$_3$ powder and YAG fluorescent material powder in a shape of flat plate by compression molding or the like may be bonded onto the light emitting element 403 or the base member 406 by using an adhesive.

In the fourth embodiment, positive and negative electrodes of the light emitting element 403 are directly connected to the first and second electrically conductive members by means of an electrically conductive joining member, without using electrically conductive wire. In case the optical-semiconductor element 403 is mounted before the base member 406 is formed, a trouble of wire deformation during a molding can be avoided by connecting without a wire, as described above.

Embodiment 5

Figure 7A:
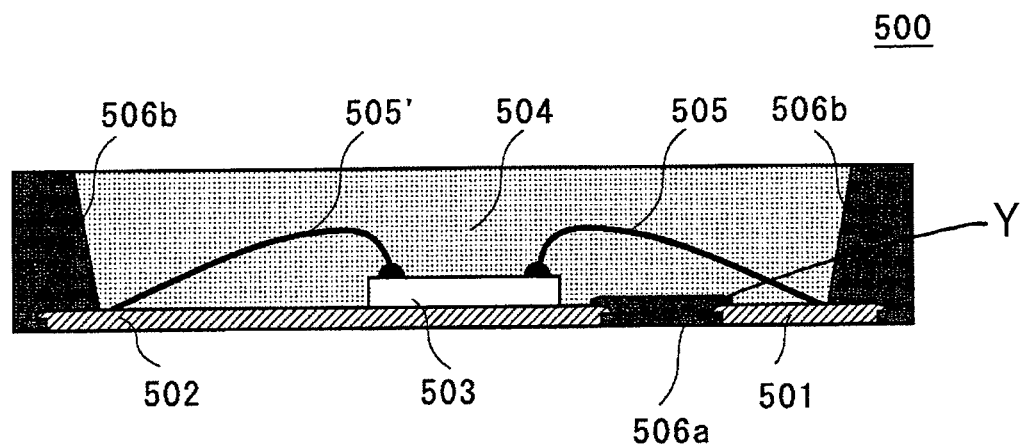
FIG. 7A is a sectional view of the optical-semiconductor device of the present invention.
Figure 7B:
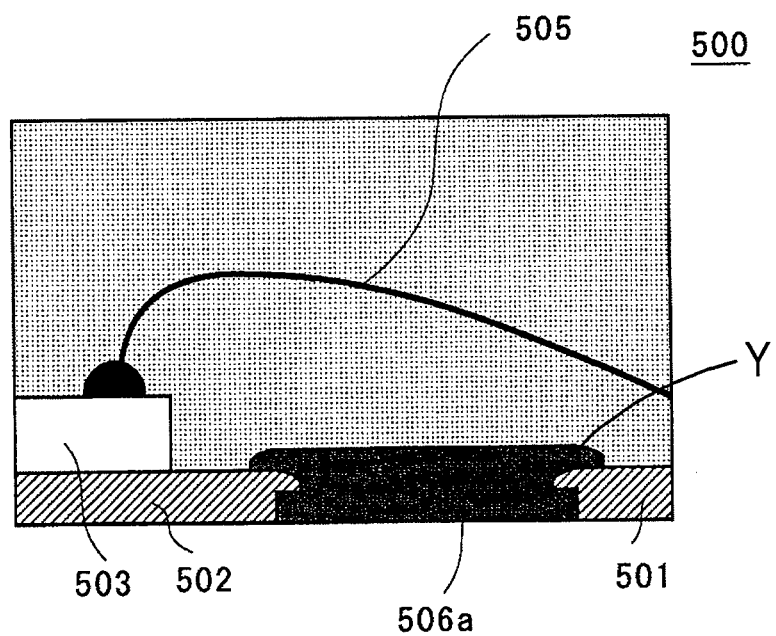
FIG. 7B is an enlarged sectional view of a part of the optical-semiconductor device shown in FIG. 7A.

FIG. 7A is a sectional view showing the optical-semiconductor device of this embodiment, and FIG. 7B is a partially enlarged view of FIG. 7A. The optical-semiconductor device of the fifth embodiment has an exterior similar to that of the optical-semiconductor device shown in FIG. 3A. A recess is formed by the protruding portion 506b serving as side wall surrounding the light emitting element 503. In this recess, the base member 506 has a bottom portion 506a that is lower than the protruding portion 506b serving as the side wall of the recess. However, the optical semiconductor device is different from that in FIG. 3A in that the top surface of the bottom portion 506a is higher than the top surfaces of the first electrically conductive member 501 and the second electrically conductive member 502. Also, a projection Y is formed in the bottom portion 506a of the base member 506 so as to cover a part of the top surfaces of the first electrically conductive member 501 and of the second electrically conductive member 502, as shown in FIG. 7B. With this constitution, the bottom portion 506a of the base member 506 can be suppressed from coming down off when the support substrate is removed during the manufacturing process. Also because the bottom portion 506a of the base member 506 can be made thicker at a position near the light emitting element 503, the light emitted by the light emitting element 503 can be suppressed from leaking through the bottom portion, and therefore light can be reflected more efficiently. The bottom portion 506a of the base member 506, including projection Y is preferably formed to such a height as the electrically conductive wire 505 does not touch therewith. While it is preferable to cover a part of the top surfaces of both the first electrically conductive member 501 and the second electrically conductive member 502, it suffices to cover only one of these members. Size, position and other parameters of the region to be covered may be determined as required. Moreover, instead of providing the base member 506 between the first electrically conductive member 501 and the second electrically conductive member 502, a sub-mount formed from Si or the like, on which the light emitting element is mounted, may be disposed to straddle the first electrically conductive member 501 and the second electrically conductive member 502. This constitution makes it possible to suppress the light emitted by the light emitting element 503 from leaking through the bottom surface, and therefore light can be reflected more efficiently.

According to the method of manufacturing the optical-semiconductor device described above, the optical-semiconductor device that is compact and light in weight, and has high light-extraction efficiency and high contrast can be manufactured easily. The optical-semiconductor device can be used in (a) various display apparatuses, (b) illumination apparatus, (c) display, (d) backlight source for liquid crystal display, (e) image capturing apparatus for digital video camera, facsimile, copying machine, scanner, etc., (f) projector and the like.

What is claimed is:

1. An optical-semiconductor device comprising:
    an optical-semiconductor element;
    a first electrically conductive member to which the optical-semiconductor element is electrically connected, said first electrically conductive member having a bottom surface that constitutes an external surface of the optical-semiconductor device;
    a second electrically conductive member to which the optical-semiconductor element is electrically connected, said second electrically conductive member being separated from the first electrically conductive member, and having a bottom surface that constitutes an external surface of the optical-semiconductor device;
    a base member having a light blocking resin and is disposed between the first electrically conductive member and the second electrically conductive member so as to block light through a space between the first electrically conductive member and the second electrically conductive member, said base member having a protruding portion that protrudes above the top surfaces of the first and second electrically conductive members and has substantially the same height as the height of said optical-semiconductor element, said protruding portion constituting an external side surface of the optical-semiconductor device; and a flat plate comprising a fluorescent material and formed on said optical-semiconductor element and said protruding portion of said base member, wherein side surfaces of said first electrically conductive member and said second electrically conductive member are covered by said base member at least two external side surfaces of said optical-semiconductor device.

2. The optical-semiconductor device according to claim 1, wherein at least one external side surface of the optical-semiconductor device is formed by cutting both of the first electrically conductive member and the second electrically conductive member with the base member.

3. The optical-semiconductor device according to claim 2, wherein a side surface of the first electrically conductive member and the second electrically conductive member has a projection.

4. The optical-semiconductor device according to claim 3, wherein the projection is located away from the bottom surface of the first electrically conductive member and the second electrically conductive member.

5. The optical-semiconductor device according to claim 2, wherein said optical-semiconductor device has a substantially rectangular parallelepiped shape.

6. The optical-semiconductor device according to claim 2, wherein the optical-semiconductor element has positive and negative electrodes on the same side.

7. The optical-semiconductor device according to claim 1, wherein a side surface of the first electrically conductive member and the second electrically conductive member has a projection.

8. The optical-semiconductor device according to claim 7, wherein the projection is located away from the bottom surface of the first electrically conductive member and the second electrically conductive member.

9. The optical-semiconductor device according to claim 1, wherein said optical-semiconductor device has a substantially rectangular parallelepiped shape.

10. The optical-semiconductor device according to claim 1, wherein the optical-semiconductor element has positive and negative electrodes on the same side.

11. The optical-semiconductor device according to claim 10, wherein said positive and negative electrodes are connected to said first electrically conductive member and said second electrically conductive member, respectively, without using electrically conductive wire.

12. The optical-semiconductor device according to claim 1, wherein a difference of the linear expansion coefficient of the base member from the linear expansion coefficient of the first and second electrically conductive members is 40% or less.

13. The optical-semiconductor device according to claim 1, wherein a linear expansion coefficient of the base member is in a range from $5\times10^{-6}$/K to $25\times10^{-6}$/K.

14. The optical-semiconductor device according to claim 1, wherein the base member contains a thermosetting resin.

15. The optical-semiconductor device according to claim 1, wherein the base member contains a cured body of a thermosetting resin composition that contains a triazine derivative epoxy resin.

16. The optical-semiconductor device according to claim 1, wherein the base member contains a cured body of a thermosetting resin composition that contains a silicone resin.

17. The optical-semiconductor device according to claim 1, wherein said protrusion portion reaches the side faces of said optical-semiconductor element.

18. The optical-semiconductor device according to claim 17, wherein said base member is made of the light blocking resin and constitutes a bottom external surface of said optical-semiconductor device.

19. The optical-semiconductor device according to claim 1, wherein said base member is made of the light blocking resin and constitutes a bottom external surface of said optical-semiconductor device.

20. The optical semiconductor device according to claim 1, wherein both said first electrically conductive member and said second electrically conductive member have a non-bended form.

* * * * *